United States Patent [19]

Ecklund

[11] Patent Number: 4,691,175
[45] Date of Patent: Sep. 1, 1987

[54] ADAPTIVE PHASE LOCKED LOOP HAVING A VARIABLE LOCKING RATE

[75] Inventor: Lawrence M. Ecklund, Wheaton, Ill.

[73] Assignee: Motorola, Inc., Schaumburg, Ill.

[21] Appl. No.: 797,735

[22] Filed: Nov. 14, 1985

[51] Int. Cl.$^4$ .......................................... H03L 07/06
[52] U.S. Cl. ................................... 331/1 A; 331/17; 331/DIG. 2
[58] Field of Search .................. 331/1 A, DIG. 2, 17; 307/25, 525, 526; 328/138, 155; 381/2, 12, 15, 16

[56] References Cited

U.S. PATENT DOCUMENTS

| 4,503,397 | 3/1985 | Schultz | 381/12 X |
| 4,541,109 | 9/1985 | Shimizu et al. | 381/15 |
| 4,570,131 | 2/1986 | Lingstaedt | 331/17 X |

Primary Examiner—Eugene R. LaRoche
Assistant Examiner—David Mis
Attorney, Agent, or Firm—Donald B. Southard

[57] ABSTRACT

An adaptive phase locked loop being particularly useful with low frequency input signals, the adaptive phase locked loop including a phase comparison unit (12) for comparing a component of the input signal with the reference signal having an average phase, a polarity detection unit (14) for providing a polarity indication signal dependent upon the polarity of the output signal, and a reference signal unit (13) for providing a reference signal having an average phase to the phase comparison unit (12). In response to the polarity indication signal, the reference signal unit (13) can vary the rate at which the average phase of the reference signal can be changed at either of two rates, with the first rate representing a relatively slow rate and the second rate representing a relatively fast rate. The device (10) also includes a reset unit (16) that also responds to the polarity indication signal to reset and reinitialize the reference signal unit (13) in response to a preselected phase comparison unit output polarity.

16 Claims, 5 Drawing Figures

Fig. 1 —PRIOR ART—

ADAPTIVE PHASE LOCKED LOOP HAVING A VARIABLE LOCKING RATE

TECHNICAL FIELD

This invention relates generally to phase locked loop devices, particularly when used in conjunction with low frequency signals.

BACKGROUND ART

Phase locked loops are well known in the art. With reference to FIG. 1, a typical prior art phase locked loop includes a phase detector (A), a filter (B), a voltage controlled oscillator (C), and a divide-by-N unit (D). An input signal ($F_i$) having a first frequency can be input to the phase detector (A). The output of the phase detector (A), after being filtered by the filter (B), provides a drive signal for the voltage controlled oscillator (C).

Through a feedback loop, the output of the voltage controlled oscillator (C) is divided by N and used by the phase detector (A) as a reference signal for comparison with the incoming signal ($F_i$). By virtue of this comparison, the output of the phase detector (A) comprises a signal that relates to the degree to which the input signal and the reference signal are in phase with one another.

When locked, the output signal from the voltage controlled oscillator (C) will have a frequency ($F_o$) equal to N times the frequency of the input signal ($F_i$). As one example, if N equals 1, the frequency of the output signal will equal the frequency of the input signal.

Depending upon the application, there are problems that arise when using such phase locked loops. For instance, the locking speed of a phase locked loop can vary with the frequency of the incoming signal. In general, the lower the frequency of the incoming signal, the longer the lock in time due to corner frequency needs.

Certain applications display particular sensitivity to such a time delay. For example, consider the pilot tone component of a transmitted AM stereo signal. Upon sensing this pilot tone signal, a radio receiver can ignite a "Stereo" indicator lamp and activate the associated stereo matrix network. In these respects, the use of a pilot tone in the AM stereo setting essentially parallels the use of a pilot tone in FM stereo broadcasting. Unlike FM pilot tones, however, the AM stereo pilot tone has a low frequency (25 Hz) and is broadcast with only 5 percent modulation. This relatively slowly cycling, low amplitude signal makes detection by a prior art phase locked loop time consuming. Through use of ordinary techniques, locking onto such a signal will often take many seconds. This constitutes an unacceptable delay in such a product.

There therefore exists a need for a phase locked loop device that can quickly lock on a low frequency signal.

SUMMARY OF THE INVENTION

These needs and others are substantially met by provision of the adaptive phase locked loop disclosed in this specification. This adaptive phase locked loop includes generally a signal input unit, a phase comparison unit, a polarity detection unit, and a reference signal unit.

The signal input unit serves to receive the incoming signal and the phase comparison unit serves to compare some preselected component of this input signal with a reference signal having an average phase. In response to this comparison, the phase comparison unit (such as, for instance, a phase detector, an in-phase detector, or a quadrature detector) provides an output signal that relates to the degree to which the input signal component and the reference signal are in phase with one another.

The polarity detection unit receives the output signal from the phase comparison unit and compares this signal with a reference signal to determine the relative polarity of the output signal with respect to the reference signal. In response to this comparison, the polarity detection unit provides a polarity indication signal that relates to the sensed polarity of the output signal.

The reference signal unit receives the polarity indication signal and also provides the reference signal to the phase comparison unit. The reference signal unit can selectively vary the average phase (and frequency) of the reference signal at either a first rate or a second rate. More particularly, the reference signal unit operates to provide a reference signal having an average phase that varies at the first rate when the polarity indication signal reflects a phase comparison output having a first polarity (such as a positive polarity) and a reference signal having an average phase that varies at the second rate when the polarity indication signal reflects a phase comparison output having a second polarity (such as a negative polarity).

In this embodiment, the second rate is substantially faster than the first rate. To accomplish this, the first rate of variation occurs in relatively small incremental steps, whereas the second rate of variation occurs in larger increments, such as a phase shift of 45 degrees or 90 degrees in a single increment.

With these capabilities, the adaptive phase locked loop can allow the phase comparison unit to operate with a reference signal having an average phase that varies at the first (slower) rate so long as the polarity indication signal indicates a positive polarity. If, however, the polarity indication signal indicates a negative polarity, then the average phase of the reference signal can be substantially shifted in one increment to speed up the locking process. This avoids the necessity of taking a plurality of smaller incremental steps (at the first rate) to reach the same average phase over a longer duration of time.

In another embodiment, the adaptive phase locked loop can be provided with a reset unit. This reset unit also responds to the polarity indication signal generated by the polarity detection unit. Upon receiving this signal, the reset unit reinitializes the reference signal unit so that the reference signal can essentially start from an original preset condition. This avoids the need to make up lost ground that would otherwise occur due to the initial degree of phase incompatibility between the input signal and the reference signal.

This reset feature, when operating alone, can save many seconds under a worst case scenario. The reset feature also further enhances the performance of the variable rate reference signal approach mentioned above when used in conjunction with such a mechanism.

BRIEF DESCRIPTION OF THE DRAWINGS

These and other attributes of the invention will become more clear upon making a thorough and complete review of the following description of the best mode for carrying out the invention, particularly when reviewed in conjunction with the drawings, wherein.

BEST MODE FOR CARRYING OUT THE INVENTION

Figure 1:
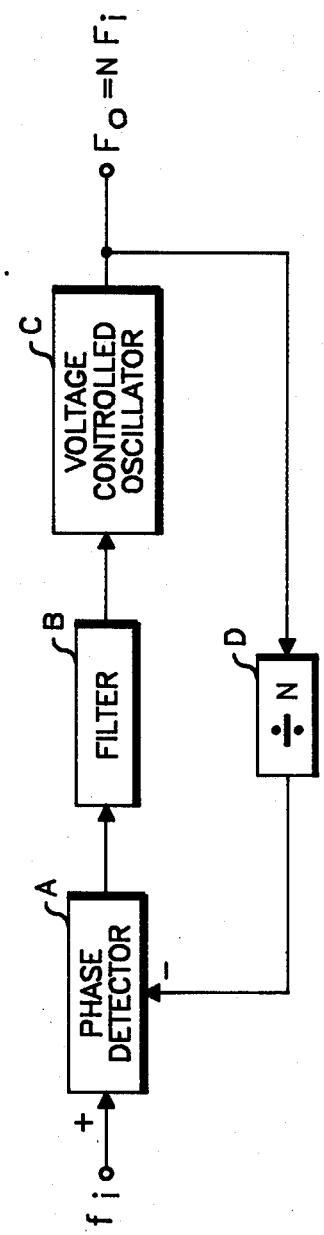
FIG. 1 comprises a block diagram view of a prior art phase locked loop.
Figure 2:
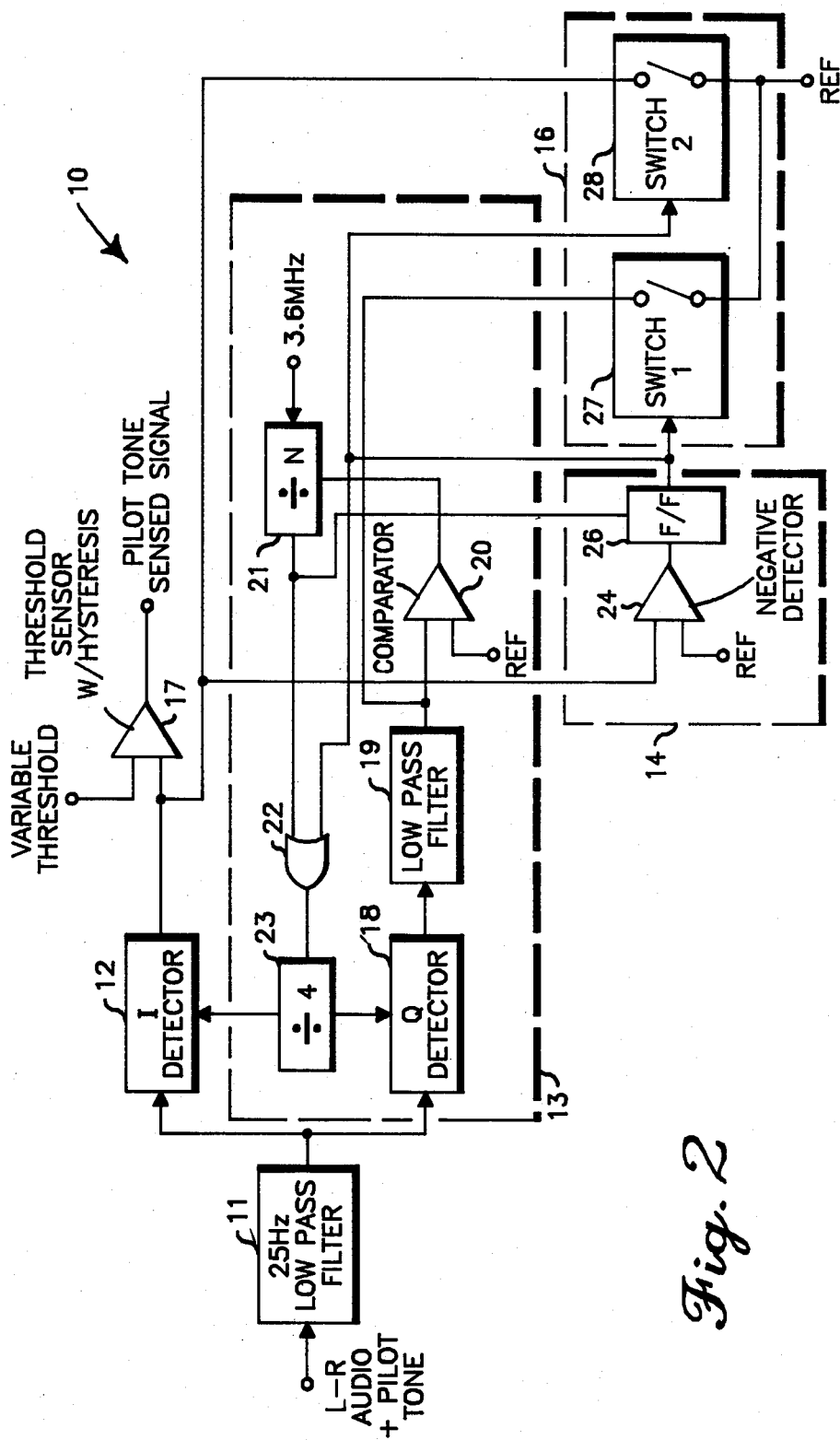
FIG. 2 comprises a block diagram view of the invention.

Referring now to the drawings, and in particular to FIG. 2, the device can be seen as depicted generally by the numeral 10. The device (10) includes generally a signal input unit (11), a phase comparison unit (12), a reference signal unit (13), a polarity detection unit (14), and a reset unit (16). Each of these generally referred to components will now be described in more detail in seriatim fashion.

The makeup and functioning of the input signal unit (11) will of course depend upon the particular application intended. Presuming, for purposes of illustration, that this described embodiment will be used to lock on to an AM stereo pilot tone, the input signal unit (11) can be comprised of a lowpass filter. It can be presumed that the incoming signal comprises that portion of an AM stereo signal that is made up of left minus right audio (L−R) in addition to a 25 Hz pilot tone. The lowpass filter comprising the signal input unit (11) can therefore have a corner frequency of 25 Hz.

The device (10) as depicted has two units that provide phase comparison functions. One comprises an in-phase detector (commonly referred to as an I detector) (12) and the second comprises a quadrature detector (commonly referred to as a Q detector) (18). It is the I detector (12) that comprises the phase comparison unit of this embodiment.

The in-phase component of the input signal (as filtered) has its frequency and phase compared with the average frequency and average phase of a reference signal in the I detector (12). Such in-phase detectors are well known in the art, and no detailed explanation need be provided here, save to note that the output of the I detector (12) comprises a signal that relates in value to the degree to which the in-phase component of the input signal is in phase with the reference signal. More particularly, the filtered output of the I detector can be described as $A\cos\phi$, where "A" is a variable related to the amplitude of the carrier, and "$\phi$" represents the phase angle difference between the input signal and the reference signal.

The output of the I detector (12) connects to the polarity detection unit (14) and to a threshold sensor (17). The threshold sensor (17) compares the output of the I detector (12) with a threshold (which may be selectively variable) in order to detect the presence of the pilot tone. When the I detector output signal exceeds the threshold input, a pilot tone sense signal will be provided for purposes as described above.

The reference signal unit (13) includes the Q detector (18) referred to above, a lowpass filter (19), a comparator (20), a divide-by-N unit (21), an OR gate (22), and a divide-by-4 unit (23). Each of these generally referred to components of the reference signal unit (13) will now be described in more detail.

The Q detector (18) receives the input signal (as filtered) and compares this signal with the reference signal generated by the divide-by-4 unit (23) as described below. Based upon this comparison, the Q detector (18) provides an output that relates to the degree of phase comparability between these signals. More particularly, the output of the Q detector (18) can be described as $A\sin\phi$, where "A" is a variable related to the amplitude of the carrier, and "$\phi$" represents the phase angle difference between the input signal and the reference signal. This output signal then passes through a lowpass filter (19) having a very low corner frequency, such as 0.5 Hz. The output of the lowpass filter (19) connects to the sense input of a comparator (20), the reference input of which connects to a reference voltage. The output of the comparator (20) constitutes a modulus control signal that effectively controls the output of the divide-by-N unit (21) as explained in more detail below.

The divide-by-N unit (21) receives a base reference signal having a stable frequency (for example, 3.6 MHz), and provides an output signal at either of two preselected frequencies (for example, 97.6 Hz and 102.4 Hz). The modulus control signal (i.e., the output signal of the reference unit comparator (20)) controls which signal frequency the divide-by-N unit (21) provides.

The output of the divide-by-N (21) unit connects to one input of the two input OR gate (22), the output of which connects to the input of the divide-by-4 unit (23). Depending upon which signal the divide-by-N (21) unit provides, the divide-by-4 unit (23) will provide a reference signal having a frequency of either 24.4 Hz or 25.6 Hz. It may be noted that these signals have a frequency slightly on either side of the known 25 Hz frequency of the incoming pilot tone signal. The reference unit (13) operates to provide a reference signal having an average phase and an average frequency that depends in value upon how often the divide-by-N unit (21) switches the frequency of its output signal, which in turn depends upon the variations in the output state of the reference unit comparator (20).

During the locking phase, the reference signal unit (13) can vary the average phase of the reference signal at an essentially constant rate. These variations occur as a function of small incremental steps made by incremental changes to the switching of the divide-by-N unit (21). If the initial average phase of the reference signal happens to be relatively close to the phase of the incoming pilot tone signal, this first rate of varying the average phase will generally allow the device (10) to lock on to the pilot tone in a relatively short period of time. When the original phase difference between the incoming signal and the reference signal is more prominent, however, this first rate allows unacceptable delay.

The polarity detection unit (14) includes generally a negative detector (24) and a flip-flop (26). The negative detector (24) comprises a comparator circuit that compares the output of the I detector (12) with a polarity reference value. The output of the negative detector comparator (24) comprises a function of the polarity of the output signal from the I detector (12) with respect to the polarity reference signal.

The output of the polarity detection unit comparator (24) connects to the latch input of the flip-flop (26). The output of the flip-flop (26) connects to the reset unit (16) and also to the remaining input of the reference signal unit OR gate (22). The flip-flop (26) also connects to the output of the divide-by-N unit (21) to allow the latched state of the flip-flop (26) to be periodically cleared.

So configured, the flip-flop (26) will change state when the output of the I detector (12) provides an output signal having a particular predetermined polarity with respect to the polarity reference signal. For instance, the flip-flop (26) can be set to latch whenever the output of the I detector (12) appears negative. When latched, the flip-flop (26) will effectively subtract one pulse from the pulse train being provided to the input of the divide-by-4 unit (23). This deleted pulse will cause the average phase of the reference signal to move by 90 degrees.

The next output pulse from the divide-by-N unit (21) will clear the latched state of the flip-flop (26) and normal processing can continue as described above, unless the output of the I detector (12) again appears negative, in which case the flip-flop (26) will again latch and subtract yet another pulse to move the average phase yet another 90 degrees.

This subtraction of a pulse essentially comprises a means by which the reference signal unit (13) can vary the average phase of the reference signal at a second rate. This second rate is, of course, much faster than the first rate of phase variation referred to above.

The reset unit (16) can be comprised of a first switch (27) and a second switch (28). These switches (27 and 28) can be comprised of transistors or the like in accordance with well understood prior art technique. When the polarity detection unit flip-flop (26) latches, these switches (27 and 28) and momentarily closed. Closure of these switches (27 and 28) applies a predetermined reference signal to the sense input of the reference signal unit comparator (20) and to the sense input of the negative detector comparator (24) of the polarity detection unit (14). These reference signals will preordain the output of these comparators and effectively result in reinitializing the reference signal unit (13). In other words, upon detecting the negative polarity of the output signal of the I detector (12), the reset unit (16) will cause the reference signal unit (13) to begin anew as if the input signal had just been received. Such resetting can result in significant savings of time.

A more precise description of certain of the components of the device (10) will now be described with reference to FIG. 3.

The negative detector (24) of the polarity detection unit (14) can be comprised of two transistors (31 and 32) and two resistors (33 and 34), in addition to a drive transistor (36) and a third resistor (37) associated therewith. The two transistors (31 and 32) have their emitters connected to a $V_{CC}$ source by the first resistor (33). The base of the first transistor (31) connects to the output of the I detector (12). The base of the second transistor (32) connects to a reference source to receive a $V_{REF1}$ reference signal. The collector of the first transistor (31) connects to ground and the collector of the second transistor (32) connects to ground through a resistor (34), and also to the base of the drive transistor (36). The emitter of the drive transistor (36) connects to ground and the collector connects to the $V_{CC}$ source through the third resistor (37) and to the data port of the polarity detection unit flip-flop (26).

The Q output of this flip-flop (26) connects to the reference signal unit OR gate (22) and to the reset unit (16) as described above. The clock port of this flip-flop (26) connects as described below.

The divided-by-N unit (21) can be comprised of, for example, an MC14020B 14 bit binary counter as manufactured by Motorola, Inc. The clock input for this part can be received at pin 10. Four of the divider point outputs (pins 5, 7, 9, and 13) connect to the inputs of a four input AND gate (38). In addition, pin 13 comprises the primary output for the divide-by-N unit (21) and therefore also connects to the reference signal unit OR gate (22) as described above. Another divider point for the divide-by-N unit (21) (pin 6) connects to one input of a two input OR gate (39), the remaining input of which connects to receive the modulus control output signal of the reference signal unit comparator (20) as referred to above. The output of this OR gate (39) connects to one input of an AND gate (41), the remaining input of which connects to the output of the four input AND gate (38), and the output of which connects to the reset input (pin 11) of the divide-by-N unit (21).

The primary output (pin 13) of the divide-by-N unit (21) connects through a resistor (42) to the base of a transistor (43). The emitter of this transistor (43) connects to ground and the collector connects through a resistor (44) to $V_{CC}$ and also to the clock input of the polarity detection unit flip-flop (26). Hence, each primary output pulse of the divide-by-N unit (21) will also clock the polarity detection unit flip-flop (26).

The divide-by-4 unit (23) may be comprised of an MC14013 as manufactured by Motorola, Inc. The input to this divide-by-4 unit (23) (pin 4) connects through a capacitor (46) to ground and through a resistor (47) to the output of the two input OR gate (22) described above. This capacitor and resistor (46 and 47) filter the incoming signals sufficiently to prevent false triggering and to assure that the subtracted pulse will indeed be subtracted from the pulse train.

The $Q_1$ output and the $D_2$ data port of the divide-by-4 unit (23) are connected in common and provide a reference signal for phase comparison purposes to the I detector (12). The not-$Q_2$ output and the $D_1$ data port of the divide-by-4 unit (23) are connected in common and provide a reference signal for phase comparison purposes to the Q detector (18).

Figure 3:
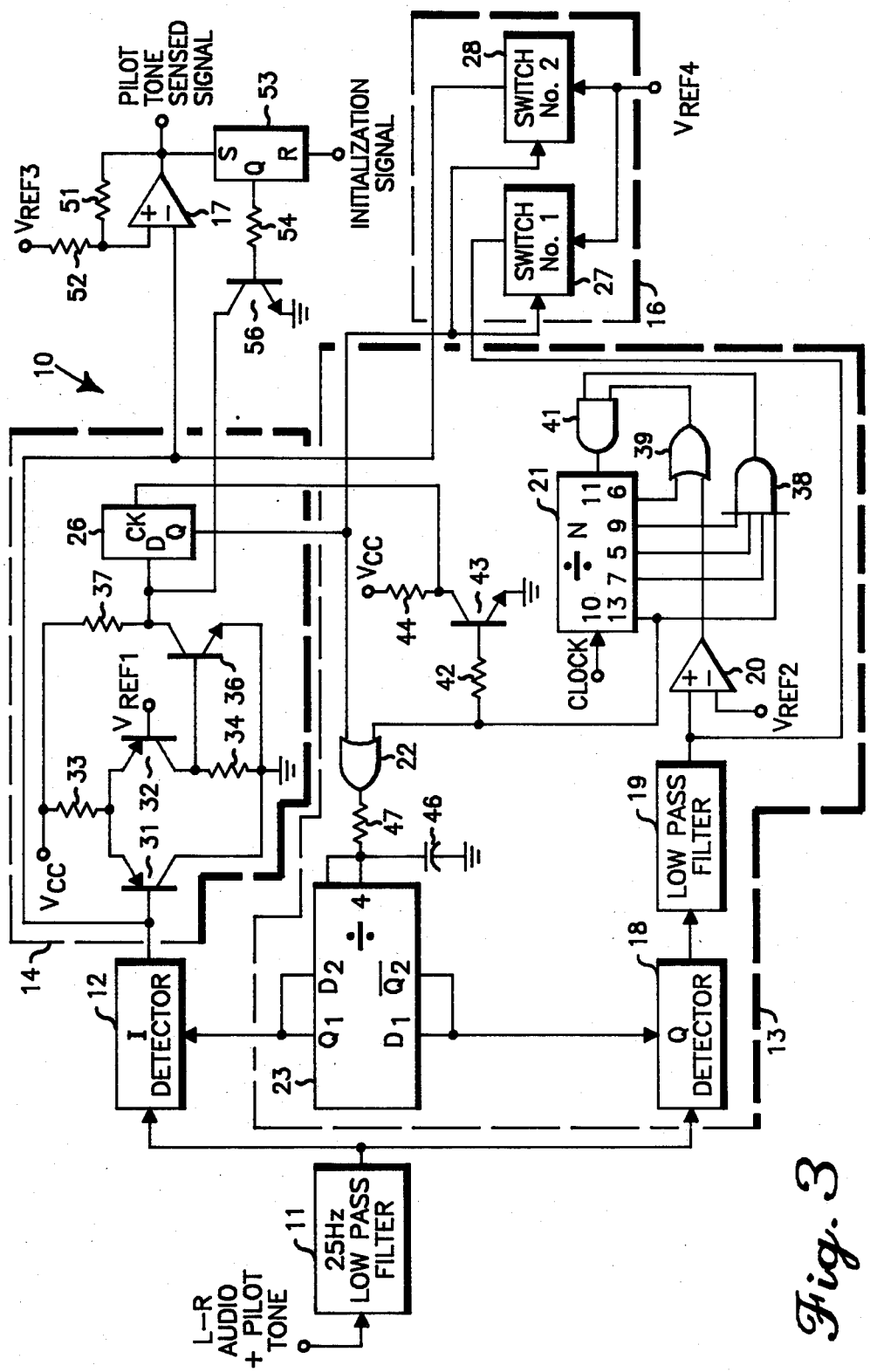
FIG. 3 comprises a more detailed view of the invention.

It may be noted with respect to FIG. 3 that the threshold sensor (17) referred to above may be provided with hysteresis through provision of a feedback resistor (51) that connects between the output of the comparator (17) and the noninverting input thereof. To establish a reference, the noninverting input of this comparator (17) can also connect through another resistor (52) to a reference source that provides a $V_{REF3}$ reference signal.

In addition to providing a pilot tone sensed signal at the output of this comparator (17), the comparator (17) can be connected to the set input of a flip-flop (53). The Q output of this flip-flop (53) can be connected through a resistor (54) to the base of a transistor (56). The emitter of this transistor (56) can connect to ground and the collector can connect to the data input port of the polarity detection unit flip-flop (26). The reset port of this flip-flop (53) can be connected to receive any appropriate initialization signal as may be desired. So configured, when the pilot tone signal has been sensed as indicated by the appearance of the pilot tone sensed signal at the output of the threshold sensor (17), the flip-flop (53) connected thereto will latch and effectively ground the data input port of the polarity detection unit flip-flop (26). This, in turn, will lock the output state of the polarity detection unit flip-flop (26) to ensure that minor variations in the input signal will not disturb the locked state of the device (10).

Figure 4:
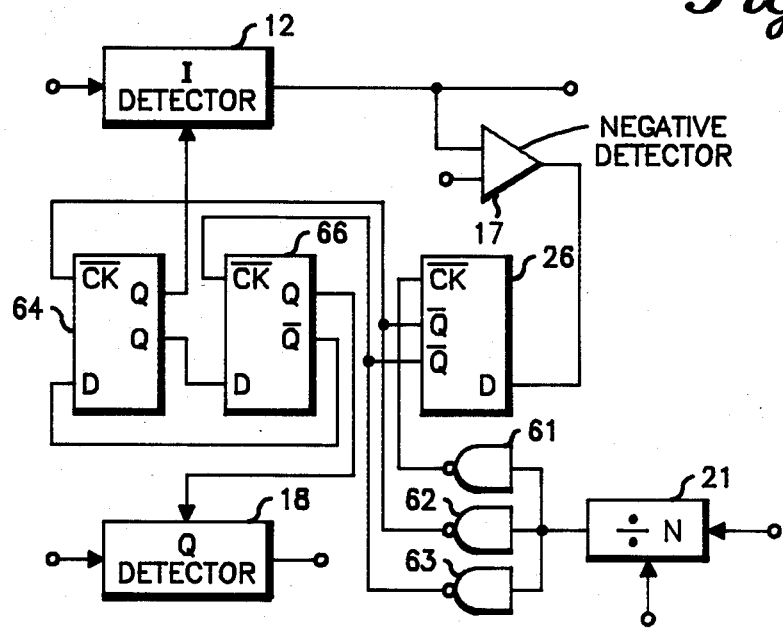
FIG. 4 comprises a schematic detailed diagram of an alternative embodiment.

An alternative pulse subtraction embodiment will now be described with respect to FIG. 4.

As with the above described embodiment, an I detector (12) and a Q detector (18) are provided and serve the same purposes as above. And again, the output of the I detector (12) connects to the sense input of a negative detector (17), the output of which connects to the data port of a flip-flop (26).

Unlike the above described embodiment, however, the output of the divide-by-N unit (21) connects to the inputs of three one input NAND gates (61, 62, and 63). The output of the first NAND gate (61) connects to the clock port of the flip-flop (26). The output of the second NAND gate (62) connects to the clock port of a second flip-flop (64), the clock port of which also connects to the not-Q output of the polarity detection unit flip-flop (26). Finally, the output of the third NAND gate (63) connects to the clock port of a third flip-flop (66), the clock port of which also connects to the not-Q output of the polarity detection unit flip-flop (26). The data port of the second flip-flop (64) connects to the not-Q output of the third flip-flop (66), and the data port of the third flip-flop (66) connects to a Q output of the second flip-flop (64). Another Q output of the second flip-flop (64) provides the reference signal for phase comparison purposes to the I detector (12), and the Q output port of the third flip-flop (66) provides the reference signal for phase comparison purposes to the Q detector (18).

When the polarity detection unit flip-flop (26) has been toggled, the two remaining flip-flops (64 and 66) will be prevented from further output state changes as might otherwise be caused by the divide-by-N unit (21) until one cycle has passed. In effect, this arrangement will result in subtracting one pulse from the pulse train that comprises the reference signal, and this subtraction will occur whenever the negative detector (17) determines the output polarity of the I detector (12) to be negative.

As previously stated, the subtraction of one pulse will result in a 90 degree phase shift in the average phase of the reference signal as provided to the I detector (12).

Figure 5:
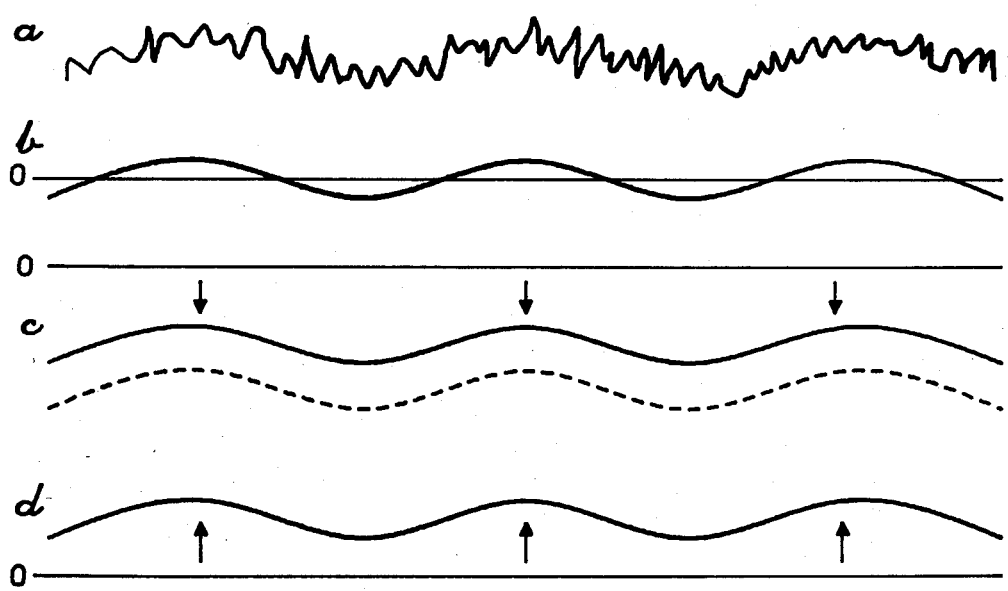
FIG. 5 depicts various waveforms that demonstrate operability of the invention.

With respect to FIG. 5, certain waveforms will be described that relate to the operation of the device (10). The output of the signal input unit (11) might appear, for example, as depicted in FIG. 5a. This signal essentially comprises a 25 Hz signal having other signal components modulated therewith.

In the absence of the pilot tone component, the output of the I detector (12) might appear as shown in FIG. 5b.

FIG. 5c represents the attempted detection of the pilot tone signal when the output of the I detector (12) proceeds in a negative direction. In the absence of the improvements noted above, this waveform could drift in the negative direction for a significant time and to a significant value as represented by the phantom line. Instead, through provision of the improvements noted above, the average phase of the reference signal provided to the I detector (12) will be moved 90 degrees as soon as the signal begins moving in the negative direction. As a result, the output of the I detector (12) will move in the positive direction more quickly as depicted in FIG. 5d to its final locked in value.

Through provision of the described device (10), a low frequency signal can be detected and phase locked in a relatively short period of time in a predictable and regular fashion. In an AM stereo receiver, this can mean initiation of the stereo decoding process very shortly following location of the desired station, as versus a noticeable and annoying delay between locating the station and initiation of the stereo decoding process.

As described earlier, the above circuit operates to provide a second faster rate of phase variation in the reference signal by subtracting a pulse from the stream of pulses provided by the divide-by-N unit (21) to the divide-by-4 unit (23). The purpose of subtracting this pulse is, of course, to move the average phase of the reference signal 90 degrees. It makes no particular difference, however, whether this 90 degree phase shift occurs in one direction or the other, so long as the direction of movement remains constant and predictable. In other words, precisely the same benefits will result if the device (10) could operate to add one pulse as versus subtract one pulse. Those skilled in the art will recognize this as an obvious modification of the above described structure.

Those skilled in the art will recognize many other modifications and variations that could be made with respect to the above explained circuitry. Because of this, the following claims should not be viewed as being limited to the precise embodiments set forth except where such limitations are expressly set forth in the claims.

I claim:

1. In a phase locked loop having:
   (i) signal input means for receiving an input signal; and
   (ii) first phase comparison means for comparing at least some component of said input signal with a second signal having an average phase and for providing an output signal related to the degree to which said input signal and said second signal are in phase with one another;
   an improvement comprising:
   (A) second phase comparison means for comparing at least some component of said input signals with a reference signal and for providing a second phase comparison means output signal related to the degree to which said input signal and said reference signal are in phase with one another;
   (B) polarity detection means for providing a polarity indication signal dependent upon the polarity of said second phase comparison means output signal; and
   (C) signal means for receiving said polarity indication signal and for providing said second signal, said signal means having means to selectively vary the average phase of said second signal at a first rate and at a second rate, such that said signal means will provide:
      (i) said second signal having said phase that varies at said first rate when said polarity indication signal reflects a phase detector output having a first polarity; and
      (ii) said second signal having said phase that varies at said second rate when said polarity indication signal reflects a phase detector output having a second polarity.

2. The improvement of claim 1 wherein said second phase comparison means comprises an in-phase detector.

3. The improvement of claim 1 wherein said input signal includes a 25 Hz pilot tone.

4. The improvement of claim 1 wherein said polarity detection means includes means to compare said second phase comparison means output signal with a polarity reference signal to determine polarity of said second phase comparison means output signal relative to said polarity reference signal.

5. The improvement of claim 1 wherein said first rate is slower than said second rate.

6. The improvement of claim 5 wherein said first polarity equates to a positive signal level.

7. The improvement of claim 1 wherein said second signal may be varied at said first rate by making incremental changes of a first size in said average phase of said second signal.

8. The improvement of claim 7 wherein said average phase of said second signal may be varied at said second rate by making incremental changes of a second size in said average phase of said second signal, wherein said incremental changes of a second size are larger than the incremental changes of a first size.

9. The improvement of claim 8 wherein said larger incremental shift in said average phase comprises a 90 degree phase shift.

10. The improvement of claim 1 and further including reset means responsive to said polarity indication signal for reinitializing said signal means to thereby provide a predetermined said second signal when said polarity indication signal reflects a predetermined phase comparison means output polarity.

11. The improvement of claim 10 wherein said predetermined phase comparison means output polarity that causes reinitialization of said signal means is a negative level signal.

12. In a phase locked loop having:
  (i) signal input means for receiving an input signal; and
  (ii) first phase comparison means for comparing at least some component of said input signal with a second signal having an average phase and for providing an output signal related to the degree to which said input signal and said second signal are in phase with one another;
an improvement comprising:
  (A) second phase comparison means for comparing at least some component of said input signal with a reference signal and for providing a second phase comparison means output signal related to the degree to which said input signal and said reference signal are in phase with one another;
  (B) polarity detection means for providing a polarity indication signal dependent upon the polarity of said second phase comparison means output signal;
  (C) signal means for providing said second signal, said signal means having means to selectively vary the average phase of said second signal; and
  (D) reset means responsive to said polarity indication signal for reinitializing said signal means to thereby provide a predetermined said second signal when said polarity indication signal reflects said second phase comparison means output signal having a predetermined polarity.

13. The improvement of claim 12 wherein said predetermined phase comparison means output polarity that causes said reset means to reinitialize said signal means comprises a negative polarity.

14. The improvement of claim 12 wherein said reset means reinitializes said signal means, at least in part, by disabling said signal means from being able to selectively vary the average phase of said second signal.

15. The improvement of claim 14 wherein disabling said signal means serves to cause said signal means to provide said second signal having an average frequency than the frequency of said input signal.

16. In a phase locked loop having:
  (i) signal input means for receiving an input signal; and
  (ii) first phase comparison means for comparing at least some component of said input signal with a second signal having an average phase and for providing an output signal of the form Acos $\phi$, where "A" is a variable related to amplitude of said input signal and "$\phi$" is the phase difference between the input signal and the second signal;
an improvement comprising:
  (A) polarity detection means for receiving said output signal from said first phase comparison means and for providing a polarity indication signal dependent upon the polarity of said output signal; and
  (B) signal means for receiving said polarity indication signal and for providing said second signal, said signal means including:
    (i) second phase comparison means for comparing said at least some component of said input signal with a reference signal having an average phase and for providing a second output signal of the form Asin $\phi$;
    (ii) comparator means for comparing the output signal of said second phase comparison means with a predetermined reference level and for providing an output based upon said comparison; and
    (iii) means for providing a pulse train constituting said second signal, said pulse train being selectively provided at least at either of two frequencies, the frequency being determined by the output signal of said comparator means; said means further receiving said polarity indication signal and having pulse means to alter the provision of said pulse train in response to said signal, such that said signal means will provide said second signal having an average phase that varies at a first rate when said polarity indication signal reflects a phase detector output having a first polarity, and said second signal having an average phase that varies at a second rate when said polarity indication signal reflects a phase detector output having a second polarity.

* * * * *

UNITED STATES PATENT AND TRADEMARK OFFICE
CERTIFICATE OF CORRECTION

PATENT NO. : 4,691,175

DATED : September 1, 1987

INVENTOR(S) : Lawrence M. Ecklund

It is certified that error appears in the above-identified patent and that said Letters Patent is hereby corrected as shown below:

Column 10, line 13, after the word "frequency" please insert the word --lower--.

Signed and Sealed this

Fifth Day of January, 1988

Attest:

DONALD J. QUIGG

Attesting Officer          Commissioner of Patents and Trademarks